United States Patent [19]

Lee et al.

[11] 4,091,408
[45] May 23, 1978

[54] HIGH FREQUENCY ION IMPLANTED PASSIVATED SEMICONDUCTOR DEVICES AND MIRCOWAVE INTERGRATED CIRCUITS AND PLANAR PROCESSES FOR FABRICATING BOTH

[75] Inventors: Don H. Lee, Agoura; Kenneth P. Weller, Rancho Palos Verdes; William F. Thrower, Cerritos, all of Calif.

[73] Assignee: Hughes Aircraft Company, Culver City, Calif.

[21] Appl. No.: 762,547

[22] Filed: Jan. 24, 1977

Related U.S. Application Data

[62] Division of Ser. No. 688,662, May 21, 1976, Pat. No. 4,030,943.

[51] Int. Cl.$^2$ ..................... H01L 29/06; H01L 23/02
[52] U.S. Cl. ......................................... 357/56; 357/13; 357/55; 357/81; 357/91; 357/68
[58] Field of Search ....................... 357/13, 14, 55, 56, 357/91, 81, 68

[56] References Cited

U.S. PATENT DOCUMENTS

| | | |
|---|---|---|
| 3,743,967 | 7/1973 | Fitzsimmons ...................... 357/13 |
| 3,808.058 | 4/1974 | Henning ............................ 357/56 |
| 3,874,918 | 4/1975 | Nechtow ........................... 357/16 |
| 3,897,276 | 7/1975 | Kondo .............................. 357/91 |
| 3,961,989 | 6/1976 | Heslop .............................. 357/91 |
| 3,990,099 | 11/1976 | Duigon et al. ..................... 357/13 |

OTHER PUBLICATIONS

Proceeding of the IEEE; G Band Complementary Trapatt Diodes by King, vol. 62, No. 2, pp. 287-288, Feb. 1974.

*Primary Examiner*—Andrew J. James
*Attorney, Agent, or Firm*—William J. Bethurum; W. H. MacAllister

[57] ABSTRACT

The specification describes new high frequency ion implanted semiconductor devices, novel microwave integrated circuits employing same, and a planar fabrication process for both wherein initially an ion implantation and PN junction passivation mask is formed on one surface of a semiconductor substrate. Next a heavily doped buried region is ion implanted through an opening in the mask and into the substrate to a preselected controlled depth. Thereafter, one or more additional ion implants are made through the mask opening to complete the active device regions and a PN junction therebetween, all of which are bounded by an annular, higher resistivity unimplanted region of the semiconductor substrate. The PN junction thus formed terminates beneath the implantation and passivation mask, and the semiconductor substrate is then annealed to remove ion implantation damage and to electrically activate the ion implanted regions, while simultaneously controlling the lateral movement of the PN junction beneath the passivation mask. Such annealing does not adversely affect the conductivity and passivation characteristics of either the higher resistivity region or the passivation mask. Openings to the heavily doped buried regions in the substrate are made both opposite and coaxial to the openings in the passivation mask. Precision in the area and depth of these contact openings is achieved by use of a chemical etchant that is preferential to the substrate crystallographic orientation and the impurity concentration levels. Ohmic contact metallization is deposited into the contact openings after which the heat sink metallization is applied to either or both of the metallized contact regions.

12 Claims, 19 Drawing Figures

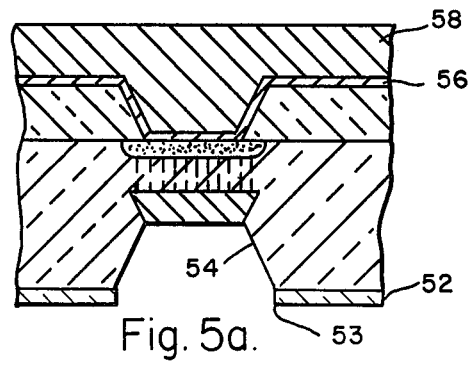
Fig. 5a.
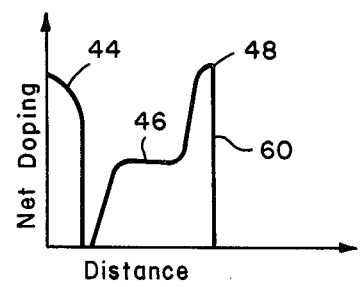
Fig. 5b.
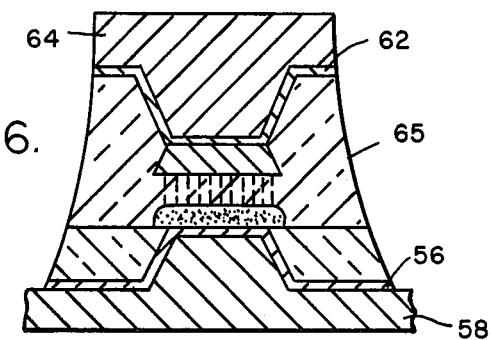
Fig. 6.
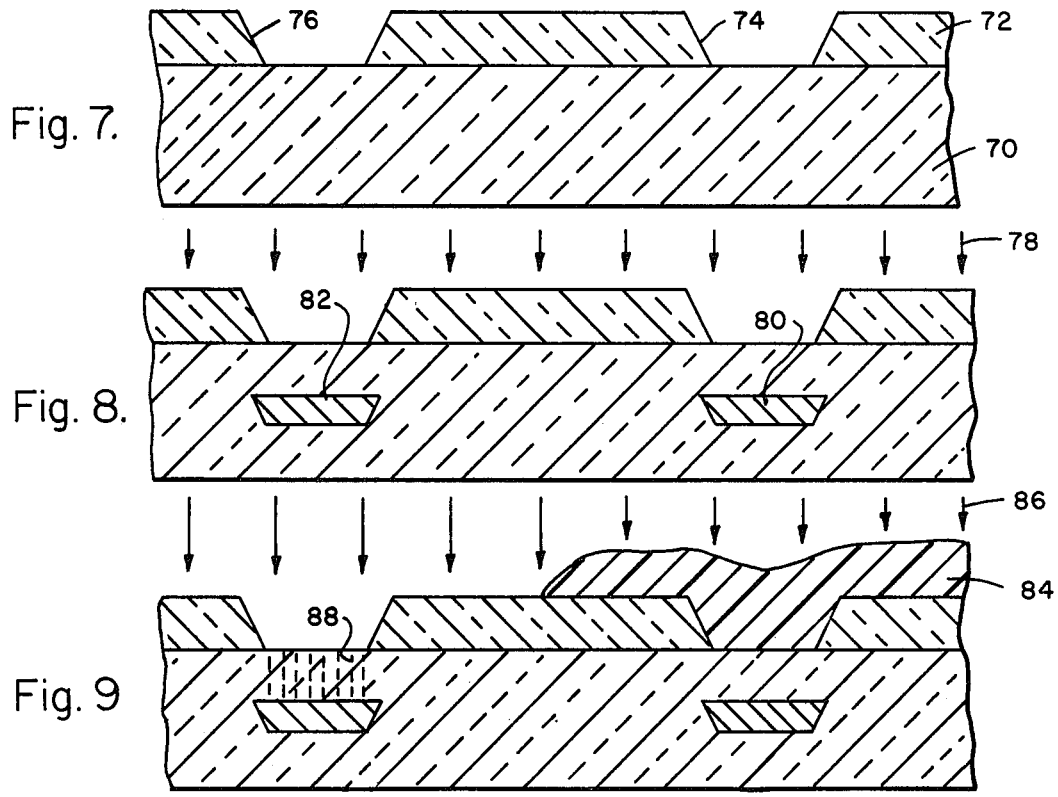
Fig. 7.
Fig. 8.
Fig. 9.

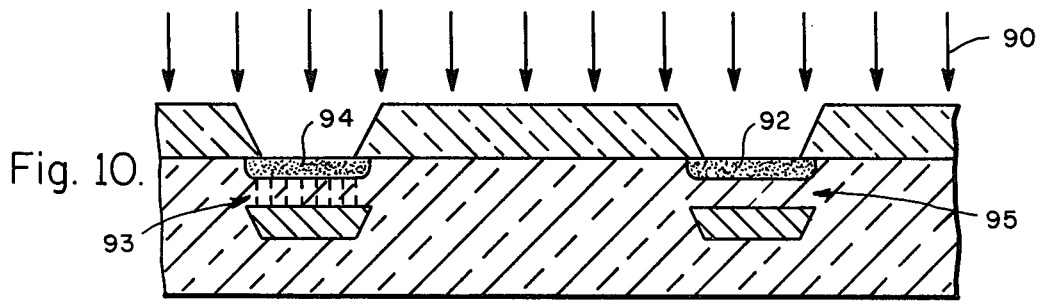
Fig. 10.
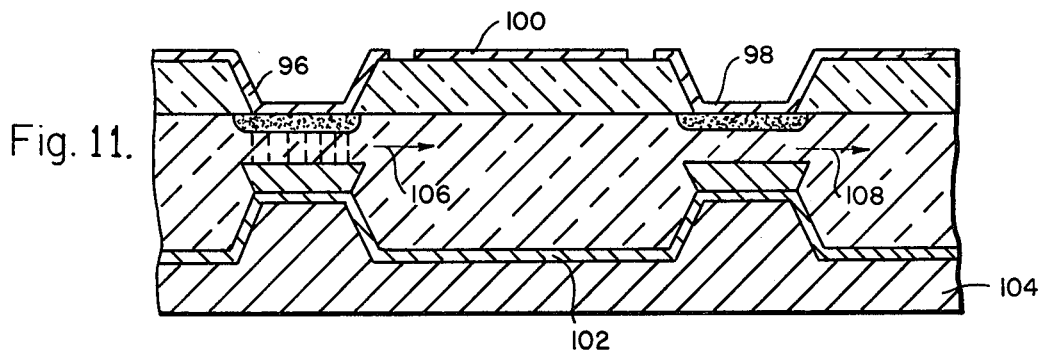
Fig. 11.
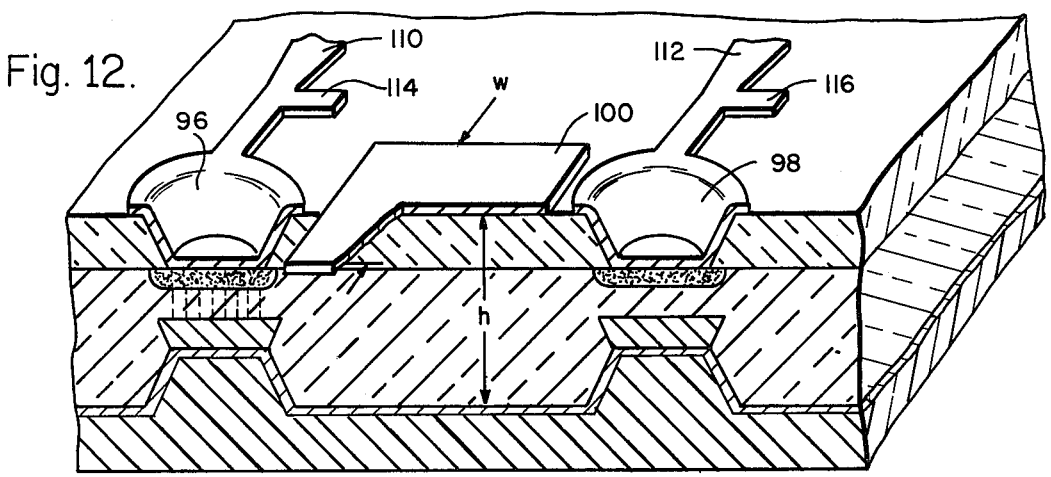
Fig. 12.
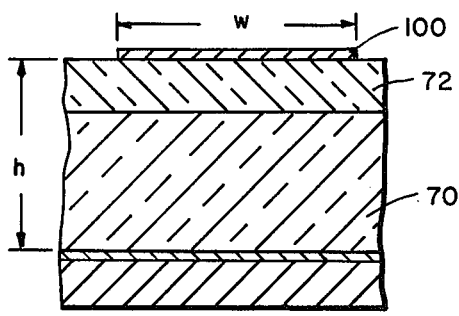
Fig. 13a.
| f (GHz) | $Z_o$ (ohms) | w (mils) | h (mils) |
|---|---|---|---|
| 30 | 50 | 10 | 14 |
| 60 | 50 | 5 | 7 |
| 94 | 50 | 3 | 5 |
| 300 | 50 | 1 | 1.5 |
Fig. 13b.

HIGH FREQUENCY ION IMPLANTED PASSIVATED SEMICONDUCTOR DEVICES AND MIRCOWAVE INTERGRATED CIRCUITS AND PLANAR PROCESSES FOR FABRICATING BOTH

This is a division of application Ser. No. 688,662 filed May 21, 1976, now U.S. Pat. No. 4,030,943, issued June 21, 1977.

FIELD OF THE INVENTION

This invention relates generally to ion implanted PN junction semiconductor devices and microwave integrated circuits, and more particularly to both discrete and integrated high frequency semiconductor diodes and waveguides therefore having improved electrical and structural characteristics. The invention is also directed to a novel planar fabrication process for achieving excellent control over PN junction area, device geometry and impurity concentration, while simultaneously controlling and minimizing the high frequency loss characteristics of the passivated structures thus produced.

BACKGROUND AND RELEVANT PRIOR ART

Solid state multi-layer avalanche diodes, such as silicon or gallium arsenide IMPATT diodes for example, have been used for several years in the microwave industry as active semiconductor devices in microwave oscillators and amplifiers. To a first order approximation, the operational frequency, $f$, in GHz of these diodes, e.g. single-drift-region IMPATT diodes, is related to the width, W, in micrometers, of the intermediate P or N type layer of three layer avalanche diodes as follows:

$$f(\text{GHz}) = 30/W(\mu m) \qquad \text{Equation (Eq.) 1}$$

In the construction of microwave oscillators and amplifiers, it has been one practice to mount these semiconductor diodes on one surface of a waveguide cavity and thereafter make DC electrical contact to these diodes using a pin or post-like connection. Such contact is necessary to supply the diodes with appropriate DC operating bias for oscillation or amplification of microwave energy.

As the maximum operating frequency requirements for these semiconductor diodes were increased, especially with the interest in increasing the operational frequency of solid state oscillators and amplifiers into the millimeter wavelength range, it became necessary to reduce the geometry of these diodes, e.g. IMPATT diodes, to produce a corresponding reduction in the width of the P and N type layers forming the diodes, as specified by Eq. 1. This requirement for reducing the geometry of these solid state diodes obviously produced a corresponding reduction in their structural strength and ability to withstand contact pressures, such as the contact pressures produced when a DC bias pin is brought directly into contact with one surface of the diode.

To alleviate the latter problem, workers in this art began to mount the diodes in a manner that would eliminate the requirement for directly contacting one surface of the diode with the DC bias pin. One of the approaches used to accomplish this involved mounting one surface of the diode on a conducting substrate forming part of an insulating package and extending a conductive ribbon from the tab of the vertical insulator down into electrical contact with the second surface of the diode. Now the upper portion of the package could be utilized for making direct pressure contact to a DC bias pin, and the diode itself was removed from any direct pressure from such a pin. This type of package structure is disclosed, for example, in an article by N. B. Kramer entitled "IMPATT Diodes and Millimeter Wave Applications Grow Up Together" *Electronics*, Oct. 11, 1971, at page 79.

The electrical characteristics of the above and other similar packaging techniques can be represented by a lumped element equivalent circuit of parasitics near the active diode. In the simplest form, this parasitic equivalent circuit consists of a lead inductance in series with the active diode, and this series combination is shunted by a parallel combination of a conductance, G, and capacitance, C, of the remainder of the package. Thus, the total parasitic equivalent capacitance C and inductance L causes the package to have a natural resonant frequency $f_{pack}$ which is inversely proportional to the square root of LC, that is:

$$f_{pack} \propto 1/\sqrt{LC} \qquad \text{Equation (Eq.) 2}$$

The above-described package must not only provide an arrangement to remove mechanical pressure from the diode as mentioned, but the electrical properties of the package must be such that they do not greatly detract from the interaction between the diode and the microwave cavity in which the diode is mounted. This is accomplished by making G small to reduce the conductance loss of the package, and by either making $f_{pack}$ much higher than the operating frequency $f$ of the diode (minimizing the impedance transformation from the diode chip to the package terminals) or by making $f_{pack}$ close to the operating frequency of the cavity in order to use the package transformation as part of the diode/waveguide impedance matching network. However, at frequencies $\geq$ 100 GHz, the parasitic inductance and capacitance associated with these packages produces a natural resonance $f_{pack}$ which is below the desired operation frequency, making it difficult to realize the proper device circuit interaction. In any event, it is desirable from the point of view of circuit design to provide a package arrangement with reproducible parasitics so that the circuit configuration can be designed to compensate for these parasitics as much as possible.

Another difficulty that arises in the construction of diodes for operation above 100 GHz is the mechanical damage that occurs to the diode during the fabrication of the package arrangement. That is, the size (area) of these diodes becomes reduced to such an extent that the strength of the metal contact bond to the diode is weakened and contact bonding failures often occur.

In the fabrication of high frequency semiconductor devices of the type described, it is also important to control the DC electrical characteristics for optimum device performance. A feature common to certain such device structures formed with a mesa geometry is the exposure of their p-n junctions to an uncontrolled environment. The electrical characteristics of these devices, notably the reverse-bias leakage currents associated with exposed or unpassivated junctions, are more difficult to control when compared to junctions that are passivated. It is desirable, therefore, to develop a package arrangement that not only has mechanical strength and low-losses at high frequencies, but one that also provides complete passivation of the p-n junction.

One prior art approach for fabricating semiconductor devices that have uniform avalanche breakdown junction characteristic of mesa device structures while providing the desirable junction passivation is described in a U.S. Pat. No. 3,649,386 issued to B. T. Murphy. In Murphy's approach, a dielectric layer, such as silicon dioxide, is formed around the edges of the mesas, so that the top surface of the dielectric layer is substantially coplanar with the top surfaces of the individual semiconductor mesas. This oxide provides surface passivation of the p-n junction as well as structural support for the mesas in a subsequent contact bonding operation. The silicon dioxide dielectric has a low conductance G and thus produces a minimum amount of resistive loss at high frequencies. To minimize the parasitic inductance L associated with this planar-mesa package, the top and bottom surface of the planarized mesas can be bonded directly to layers of contact and heat sink metallization. Such metallization completes the package for the diode, and the top and bottom metal surfaces of the above package may be contacted directly to a DC bias pin in a microwave cavity or the like.

The above planar-mesa approach to semiconductor diode packaging has, however, several distinct disadvantages, among which include the difficulty in adjusting the oxide thickness to the exact height of the mesa in order to obtain an oxide surface which is coplanar with the mesa height. Additionally, the high temperatures necessary for the thermal oxide growth cause a significant diffusion of the previously established doping profiles, resulting in degradation of device performance.

When Murphy's approach in U.S. Pat. No. 3,649,386 to junction passivation is combined with an additional etching step that produces another mesa in the oxide surrounding the previously formed semiconductor mesa, a passivated structure is formed that can be directly bonded to a heat sink, as described in U.S. Pat. No. 3,896,478 by R. Henry. The major disadvantage of this approach for high frequency devices designed to operate at millimeter-wavelengths is the large shunting reactance associated with the thin silicon dioxide layer that surrounds the p-n junction of the semiconductor mesa. Furthermore, reduction to practice of structures similar to the one purposed by Henry necessitates several complicated processing steps that result in low device yields.

Another approach for fabricating passivated semiconductor diodes of the general type described without requiring ribbon bonding and its associated housing support members is described in U.S. Pat. No. 3,558,366 to M. P. Lepselter. Lepselter's approach is to bombard selected regions of a silicon crystal with gold ions in order to raise the resistivity of the silicon crystal around the active diode regions therein. The Lepselter approach has several disadvantages, among which include the very high acceleration energies necessary to accelerate gold ions (of heavy mass) to the required depth into the silicon crystal. Other disadvantages of the Lepselter approach include the requirement for accelerating these gold ions through an oxide layer on the surface of the silicon crystal and also the ion implantation damage to the silicon crystal; in Lepselter's process this damage must either go unannealed in the fabrication of the ultimate device structure, or if annealed the annealing temperatures produce significant lateral and horizontal diffusion of the implanted gold ions, which result in either degradation or destruction of the device's PN junction geometry and performance.

Another prior art approach to fabricating devices of the general type described herein is disclosed in an article by Foyt et al entitled "Isolation of Junction Devices in GaAs Using Proton Bombardment" in *Solid-State Electronics*, vol. 12, 1969, pp. 209–214. In the above Foyt et al process, protons are utilized to bombard and raise the resistivity of certain layers of gallium arsenide IMPATT diodes in order to define the active device region of these structures and provide passivation therefor. By using proton bombardment, the Foyt et al approach does not require the high acceleration potentials required in the above Lepselter approach. But the Foyt et al approach, like the Lepselter approach, produces an ultimate device structure in which proton bombarded high-resistivity (semi-insulating) regions must necessarily be unannealed, thereby leaving the semiconductor crystal damaged in that portion of the structure bombarded by protons and immediately surrounding the active device regions of the diode structure.

Thus, the above-described Foyt et al and Lepselter approaches are similar in that both of these processes first introduce conductivity type determining impurities into the semiconductor crystal to establish the doping profiles of the active device regions and define the PN junctions therein, and thereafter utilize particle bombardment and implantation to control the exact geometry and current limiting necessary for the active device regions. Thus, this prior art sequence of processing steps leaves the particle bombardment damage present in the ultimate device structure.

Summarizing, therefore, in all of the Lepselter, Foyt et al and planar-mesa approaches described above, the impurity concentration and PN junctions for the active device regions are formed first, and thereafter geometry control, passivation and current limiting for these regions (and PN junctions) are provided last. Obviously, any attempt to anneal the semiconductor structures thus formed and remove implantation damage after completion of these implantation steps would adversely lower the resistivity of the semiconductor crystal which was intentionally raised by ion implantation in the first place. Although the passivation feature is retained in these approaches, the lower resistivity of the semiconductor leads to significant degradation of the microwave characteristics of the active device. And if annealing is attempted in the Lepselter approach described above, significant degradation of the active PN junction area is produced by the above-described enhanced diffusion effects.

RELATED APPLICATION

In our copending U.S. patent application Ser. No. 652,943 entitled "High Frequency Ion Implanted Passivated Semiconductor Devices and a Planar Process for Fabricating Same", there is disclosed and generically claimed a broad new class of high frequency semiconductor devices and related fabrication processes wherein, among other things, ion implantation and planar processing are combined in a novel manner to overcome some, if not all, of the above-described disadvantages of the prior art devices. In particular, these processes were directed to the reduction in microwave losses in planar high frequency semiconductor devices.

In the fabrication of our earlier device structures disclosed in Ser. No. 652,943, an ion implanted central region is formed by implanting selected ion species through a silicon dioxide mask and into a high-resistivity epitaxial layer to thus form active regions and PN junctions for devices such as IMPATT diodes. Thus, this oxide mask provides both ion implantation masking as well as planar passivation for the fabricated devices, and the high-resistivity epitaxial layer provides both device stabilization and current limiting for the active ion implanted central region of these devices.

While our invention disclosed and claimed in U.S. patent application Ser. No. 652,943 represents truly significant advances in this art, as explained in detail in said application, our earlier devices nevertheless required an epitaxial layer in the device fabrication process.

THE INVENTION

As is described in detail hereinafter, the present invention not only eliminates this earlier device requirement for an epitaxial layer but it also is characterized by many additional new and useful improvements directed to reducing microwave losses, improving the electrical performance, and improving the thermal properties of these newer devices. Additionally, the present application discloses and claims the fabrication of a novel microwave integrated circuit which combines a plurality of these newer devices in a monolithic integrated circuit configuration.

Accordingly, the general purpose of this invention is to provide still further new and useful improvements in the fabrication of high frequency ion implanted semiconductor devices and microwave integrated circuits, and also improvements in the geometries of these new structures. Such improved geometries provide lower parasitic losses and improved thermal and electrical characteristics relative to our earlier devices. Additionally, we disclose herein the fabrication of a novel microwave integrated circuit utilizing our new devices.

To achieve such new and useful improvements, we have discovered a novel variation of our earlier disclosed ion implanted planar devices and processes wherein no epitaxial layer is required in the device fabrication. Instead, a bulk high-resistivity semiconductor substrate is appropriately masked and directly exposed to a series of ion implantation steps in order to form, respectively, a heavily doped buried region in the semiconductor substrate and thereafter a series of ion implanted regions (and a PN junction) which are aligned with this buried region. The buried region is positioned in relatively close proximity to the PN junction of the device and enables both good ohmic contact and good heat sinking to be made closely adjacent to the active regions of the device. Thus, the semiconductor substrate resistivity, which can be made much higher than a typical epitaxial layer resistivity, serves to substantially reduce microwave losses in these devices.

The thickness or vertical extent of the surrounding high-resistivity semiconductor can be made significantly greater than in the case of an epitaxial layer. This additional increase in the height of the annular high-resistivity semiconductor decreases the parallel parasitic capacitance associated with the high-resistivity region. Heat sinking can therefore be made to both sides of the devices and thereby improve the thermal dissipation properties without increasing the parallel parasitic capacitance characteristics of these devices when mounted into microwave cavities. Additionally, the contact metallization that extends from the surface of the high-resistivity semiconductor down to the heavily doped buried region forms an equivalent series inductance which can be used advantageously at high frequencies to improve the impedance transformation from the diode chip to the microwave cavity. Furthermore, these new devices may be incorporated in a monolithic microwave integrated circuit which is fabricated in a single high-resistivity substrate and combined with stripline metallization or the like to establish efficient wave propagation paths in the circuit.

Accordingly, a general object of the present invention is to provide a new and improved high frequency semiconductor device and integrated circuit employing same, and fabrication processes therefor which achieve all of the objects and features specified in our above-identified copending application Ser. No. 652,943 without the requirement for an epitaxial layer.

Another object is to provide structures and processes of the type described which serve to further reduce microwave losses in the devices produced and also to improve the heat transfer characteristics of such devices and integrated structures.

A feature of the present invention is the fabrication of planar passivated ion implanted semiconductor devices directly into a high-resistivity substrate material.

Another feature of the invention is the provision of device structures of the type described wherein heat sinking is made to both sides of the semiconductor device, thereby improving both its heat transfer characteristics and also the parasitic capacitance characteristics microwave cavities which house these devices.

A further feature of the invention is the provision of ion implanted planar passivated semiconductor devices of the type described which may be monolithically integrated into a common substrate which serves in part as the wave propagating medium between adjacent devices and thus may be used to replace hybrid types of microwave integrated circuits.

These and other objects and features of the invention will become more readily apparent in the following description of the accompanying drawings.

DRAWINGS

FIGS. 1a through 6 illustrate a sequence of wafer processing steps which may be utilized in fabricating device structures according to the invention. These figures also include the impurity concentration profiles at various stages of the process.

FIGS. 7 through 11 illustrate a sequence of wafer processing steps which may be utilized in fabricating monolithic microwave integrated circuits according to the invention.

FIG. 12 is a perspective view of one type of monolithic microwave integrated circuit according to the invention.

FIGS. 13a and 13b list some useful height and width dimensions for the wave propagating medium of FIG. 12, and also the corresponding operational frequencies and characteristic impedances of such wave propagating medium and waves propagated therein.

DESCRIPTION OF PREFERRED EMBODIMENTS

Figure 1A:
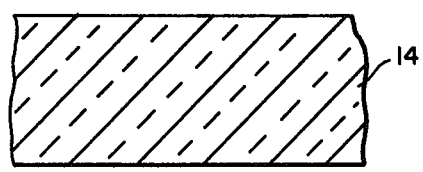
Figure 1B:
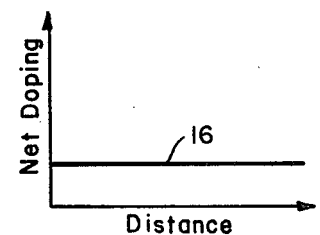

Referring now to FIGS. 1a through 6 in sequence, there is shown in FIG. 1a a high-resistivity N type substrate with a <100> crystallographic orientation and a resistivity typically on the order of 1000 ohm-centimeters. The impurity profile 16 in FIG. 1b is of course invariant across the width of the substrate 14. The silicon substrate 14 is transferred to a conventional oxide deposition, masking and etching station where a layer 18 of silicon dioxide, $SiO_2$, is either vapor deposited, thermally grown or both on the surface of the substrate 14, and a window or opening 19 is formed in the $SiO_2$ coating using conventional masking and etching procedures. The particular slanted contour of the opening 19 is a result of the lateral etching of the silicon dioxide.

Figure 2A:
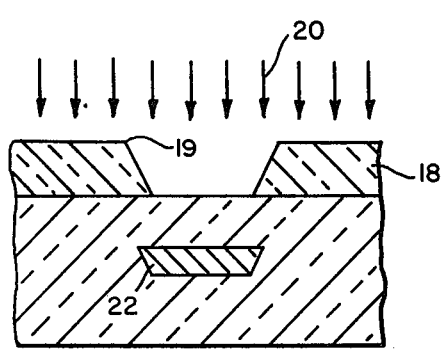
Figure 2B:
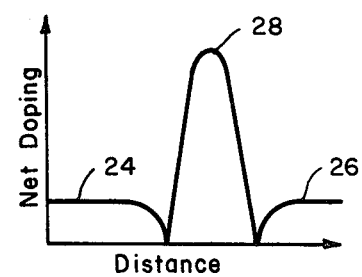

When the $SiO_2$ mask 18 in FIG. 2a has been completed, the masked wafer 14 is transferred to an ion implantation chamber wherein a P type ion beam 20, such as boron ions, are implanted into the substrate 14 to form an ion implanted buried region 22 at approximately 0.7 microns below the substrate surface, and using typically 300 keV boron ions at a dosage of approximately $5 \times 10^{15}$ ions per square centimeter. The <100> crystallographic orientation of the substrate 14 and the direction of the ion beam 20 are positioned by the geometry of the target holder in the ion implantation machine to minimize channeling effects for all ion implantations made in the substrate 14. After the implantation step used to form the buried region 22 is completed, the <100> substrate 14 is annealed for a predetermined time and temperature sufficient to electrically activate the ion implanted region 22 and to substantially eliminate any ion induced damage in the substrate 14. Alternatively, the anneal of this profile can be performed after all the implantations have been completed as discussed below. This procedure minimizes diffusional broadening effects. At this point in the process, the structure in FIG. 2a is characterized by the impurity profile shown in FIG. 2b having net doping concentration portions 24 and 26 at the original substrate doping level and separated by the intermediate Gaussian doping profile portion 28 for the ion implanted buried region 22.

Figure 3A:
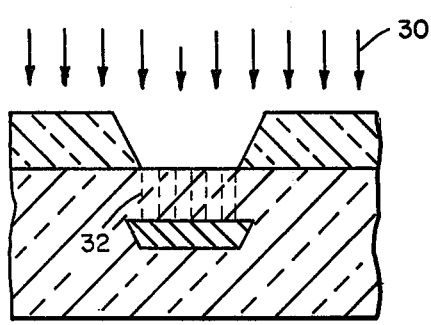
Figure 3B:
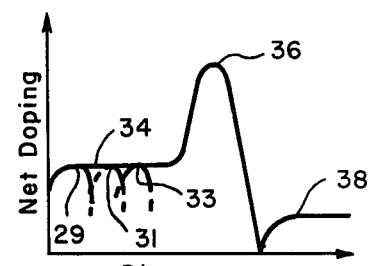

Referring to FIG. 3a, the dose energy schedule of the ion implantation process is now adjusted so that the P type boron ions 30 are introduced into the region 32 of the substrate 14 in multiple implants, as indicated by the doping concentrations 29, 31 and 33, to thus yield the approximate or composite profile 34 for the P type region 32 and extending to the surface of the substrate 14.

Figure 4:
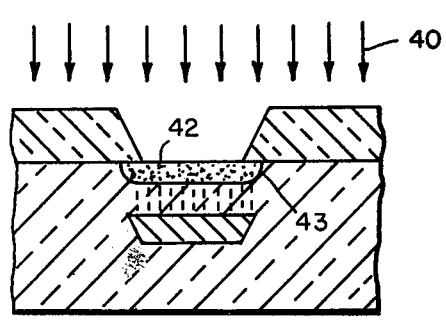
Figure 4B:
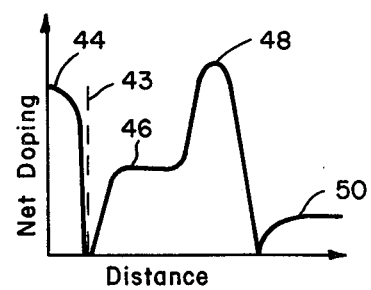

Next, the ion implanted structure of FIG. 3a is exposed to an N type ion implantation step, as indicated in FIG. 4, wherein N type ions 40, such as arsenic ions of low energy (typically - 70 keV at a dose of $2 \times 10^{15}$ ions/cm$^2$) are implanted into the structure to thereby form the planar region 42, which is a heavily doped N+ region suitable for good ohmic contact. This N type ion implant is indicated by the doping concentration 44 as shown in FIG. 4b, with of course the PN junction 43 of the implanted structure lying between the N type and P type profile portions 44 and 46. The implanted structure in FIG. 4b is then annealed for a predetermined time and temperature sufficient to electrically activate the P and N type ion implants 32, 42 and 48 respectively, and this annealing step causes the PN junction 43 to spread laterally beneath the passivating oxide mask 18 and insure full and complete passivation of this PN junction 43. The final doping profile for the implanted N+ - P - P+ diode in FIG. 4a is shown in FIG. 4b.

Referring now to FIG. 5a, a surface pattern 56 of ohmic contact metallization, such as a known chromium-platinum-gold mixture, is applied by vacuum evaporation techniques over the entire exposed surface of the insulating oxide layer 18 and into ohmic contact as shown with the N+ region 42. Then, a heat sink 58 (e.g. copper or silver) is deposited onto the top surface of the thin metallization layer 56, and thereafter the silicon substrate 14 is thinned from its backside by a chosen amount determined by deep alignment holes (not shown) in the substrate 14 previously etched after the formation of the $SiO_2$ insulating mask 18. After this thinning of the silicon substrate 14, a photoresist mask 52 having an opening 53 therein is formed on the backside surface of the silicon substrate 14 using conventional photolithographic techniques. Then, using a chemical etchant such as KOH—$H_2O$ and isopropyl alcohol, the silicon substrate 14 is anisotropically etched in the geometry 54 shown in FIG. 5a to thereby expose the buried P+ region 22. This etching step is anisotropic in that the etch rate in the <100> crystallographic plane in silicon is much greater than the etch rate in the <111> crystallographic plane, and additionally, the etch rate in the <100> direction is also dependent upon the conductivity type (N or P) in the material being etched.

Since this etch rate is approximately 20 to 50 times greater for P (or N type) doping concentrations less than about $10^{19}$ carriers per cubic centimeter than for P type (boron) doping levels greater than $10^{19}$ carriers per cubic centimeter, this etching step will remove the high resistivity N type silicon substrate 14 adjacent the P type buried region 22 at a rate of 1.0 microns per minute until it reaches the heavily boron doped P+ implanted region 22 where a significant reduction in the etch rate occurs. Because of the crystallographic preferential and concentration dependent characteristics of this KOH-$H_2O$ and isopropyl alcohol etchant, it is possible to achieve precise control and alignment of the opening 54 with the buried region 22. With this type of access to the implanted P+ buried region 22, the subsequently deposited back ohmic contact 62 and the adjoining heat sink member 64 can be formed closely adjacent to the active regions and to the PN junction of the IMPATT diode being fabricated.

The layer 62 is a thin layer of ohmic contact metallization, such as chromium-platinum-gold mixture, and member 64 is a heat sink member such as copper or silver. This member 64 provides good heat sinking to the structure, so that both sides of the IMPATT diode defined by the implanted P+P N+ regions 22, 32 and 42 are provided with both good ohmic contact and good heat sinking. Thus, the copper heat sinks 58 and 64 may be made as thick as necessary to control and reduce the parasitic parallel capacitance of the structure when it is mounted in conventional waveguide cavities or the like.

The doping concentration of the impurity profile in FIG. 5b terminates at the boundary 60 which represents the junction of the ohmic contact metallization 62 with the approximate center of the P+ region 22 where the anisotropic etching thereof was terminated. That is, the etch rate of this region 22 was reduced to approximately zero as the maximum impurity portion of the P+ buried region 22 was closely approached.

Finally, the structure in FIG. 6 is mesa-etched to remove a definite portion of the substrate 14 surrounding the ion implanted IMPATT diode and thereby leave the resultant mesa contour 65. Thus, the structure in FIG. 6 is provided with ohmic contact metallization layers 56 and 62 and heat sinks 58 and 64 on opposing sides thereof and exhibits excellent mechanical strength as a result of this particular dual heat sinking arrangement.

Summarizing, therefore, the process illustrated in FIGS. 1a through 6 requires no epitaxial layer growth and therefore enables a very high-resistivity semiconductor material (e.g. a silicon substrate) to be used as the main body of the structure, and this in turn results in lower parasitic losses at high frequencies relative to our epitaxial structures disclosed and claimed in our earlier filed copending application Ser. No. 652,943. Additionally, the preferential etching of silicon in the <100> crystallographic plane to reach the P+ buried layer 22 allows lower loss integrated package configurations to be formed than were possible with prior structures. Moreover, such preferential etching provides improved control of the diode's active area and the geometry of the semiconductor mesa surrounding the diode. For a further and more detailed discussion of such preferential etching, reference may be made to an article by M. J. Declercq entitled "A New CMOS Technology Using Anisotropic Etching of Silicon", *IEEE Journal of Solid State Circuits,* Volume SC-10, No. 4, August 1975, pages 191 et seq.

The resistive losses in the contact regions of our above-described device have been minimized as a result of our ion implanted "buried" layer 22 contact which has been previously described, and additionally, significant improvements are made in the thermal dissipation properties of our device as a result of its double heat sink arrangement. This arrangement was not possible using the process described in our copending application Ser. No. 652,943. This improvement in heat sinking is very important for devices designed to operate at millimeter-wave frequencies.

Finally, the high-resistivity semiconductor and $SiO_2$ material surrounding the active IMPATT diode is readily adaptable for configuration in both stripline and dielectric image guide geometries and for the integration of these devices into low loss planar monolithic millimeter-wave integrated circuits. The fact that the high-resistivity substrate 14 has a bulk resistivity typically on the order of 1000 ohm-centimeters means that its microwave losses will be much lower than those provided by similar epitaxial structures where resistivities greater than 10 ohm-centimeters are difficult to obtain.

Referring now in sequence to FIGS. 7 through 13b, there is illustrated a process for forming planar monolithic integrated millimeter-wave circuits using our novel implantation process, and including some of the novel features described above. Therefore, the process illustrated in FIGS. 7 through 13b will not be described in as much detail as the above-described process insofar as specific processing parameters are concerned. Additionally, the integrated circuit fabrication process described hereinbelow shows the integration of only two semiconductor devices in a common substrate, but it will be understood and appreciated that many more additional devices may be fabricated in a common substrate and using the ion implantation processes described herein.

Referring now to FIG. 7, there is shown a semiconductor wafer or substrate 70, preferably <100> silicon, upon which a silicon dioxide mask 72 has been formed using conventional oxide growth, photolithographic masking and etching techniques well known in the art. Using these photolithographic processes, openings 74 and 76 are made as shown in the oxide coating 72, and the oxide mask 72 will be used as an ion implantation mask, as is illustrated in FIG. 8. In this step, boron ions 78 are implanted into the substrate 70 at a predefined dose-energy schedule to form the P+ buried regions 80 and 82.

Next, the structure in FIG. 8 is annealed for a predetermined time and temperature sufficient to electrically activate the ion implanted buried P+ regions 80 and 82, and thereafter the structure in FIG. 8 is transferred to a photoresist masking station where a photoresist mask 84 is selectively deposited on the right-hand portion of the structure. The mask 84 serves to block out the dopant ions 86 which are implanted as shown in the structure of FIG. 9 to form a P type region 88 of the IMPATT diode being fabricated on the left-hand side of the structure. The P type region 88 corresponds, of course, to the P type region 32 in FIG. 3a above. It is understood that by adjustment of the ion beam acceleration potential and by the application of a mask arrangement similar to resist mask 84, first over opening 76 and secondly over opening 74, the implanted regions 82 and 80 can be located at different depths in the substrate 70.

Next, the structure in FIG. 9 is exposed to a shallow N type implant, using arsenic ions for example, to form the N+ region 94 of the IMPATT diode 93 as shown in FIG. 10, and also to form an identical N+ region 92 of a PIN diode 95 on the right-hand side of the structure shown. Thus, the IMPATT diode 93 is a P+P N+ single drift avalanche diode having the same impurity profile as the IMPATT diode described above in FIGS. 1 through 6a, whereas the PIN diode 95 is a P+I N+ structure whose intermediate or "I" layer is of the same impurity concentration and resistivity as the substrate member 70.

It will be appreciated of course that the two diodes 93 and 95 are only two of many active or passive semiconductor devices which may be fabricated in a common substrate 70 using the novel planar process of the present invention. This process further includes the back etching of the structure to provide exposure of the undersides of the buried regions 80 and 82, so that good ohmic contact metallization and heat sinking may be provided to these buried regions as illustrated below in FIG. 11.

The structure in FIG. 11 also includes upper surface ohmic contact metallization patterns 96 and 98 for the N+ regions of the IMPATT and PIN diodes respectively, and a stripline metallization pattern 100 is selectively deposited on the upper surface of the $SiO_2$ layer between these ohmic contact metallization patterns 96 and 98. As mentioned, a backside ohmic contact metallization layer 102 is provided as a continuous thin layer for making a common DC connection to both of the devices 93 and 95, and a copper heat sink 104 is bonded as shown to the backside contact metallization 102 to provide good heat sinking for the integrated circuit structure described. Additionally, the continuous metallization layer 102 and the copper heat sink 104 provides a ground plane for the stripline waveguide structure.

The high-resistivity silicon between the adjacent devices 93 and 95 not only provides good DC isolation for these devices, but it also provides energy propagation paths 106 and 108 adjacent each of these devices 93 and 95. Therefore, the millimeter wave energy generated at the IMPATT diode 93 is coupled via path 106 to the PIN diode modulator 95 where it is modulated in accordance with a control potential applied to terminal 98 before it is further propagated along the path 108 to some other device (not shown) in this monolithic integrated circuit. Advantageously, the geometry of the stripline metallization 100 deposited on the SiO$_2$ layer 72 establishes the E field pattern or width dimension of the path 106 of millimeter wave energy propagated between adjacent devices 93 and 95, and this path includes the SiO$_2$ layer 72 as well as the underlying high-resistivity silicon region between adjacent devices. Stripline wave propagation techniques are generally well known in the art and are described in further detail in an article by Harold Sobol entitled "Applications of Integrated Circuit Technology to Microwave Frequencies", *Proceedings of the IEEE*, Volume 59, No. 8, August 1971, at page 1200 et seq.

It should be understood, however, that the present invention is not limited to the utilization of striplines to control the propagation of energy flow between adjacent devices in the monolithic integrated circuit described, and other wave propagation structures such as a dielectric image guide of a chosen height and width may be used between adjacent devices and as a part of the monolithic integrated structure. These chosen height and width dimensions are related to the desired mode and frequency of wave propagation to be sustained in the integrated circuit, as is well known, and the dielectric image guide structure is described in more detail in a copending application Ser. No. 669,054 entitled "Dielectric Image Guide Integrated Mixer/Detector Circuit", assigned to the present assignee. Dielectric image guides are also described in an article by R. M. Knox entitled "Dielectric Waveguide: A Low Cost Option for Integrated Circuits", *Microwaves*, Volume 15, No. 3, March 1976, at page 56 et seq. Other examples of alternative waveguide structures which may be used in accordance with the present invention instead of stripline structures are disclosed in U.S. Pat. No. 3,903,488 issued to T. T. Fong, and assigned to the present assignee.

Referring now to FIG. 12, there is shown, in a partially sectioned perspective view, some exemplary surface metallization patterns which may be used to connect bias and modulating potentials to the IMPATT and PIN devices 93 and 95 respectively. These patterns 110 and 112 interconnect the ohmic contact regions 96 and 98 to supply and modulating voltages (not shown), and each line 110 and 112 is joined to an RF stub 114 and 116 respectively, which decouples RF from the power supply and modulating voltages, respectively.

Whereas the planar monolithic integrated circuit according to our invention may obviously include many devices such as the devices 93 and 95 integrated into a common substrate, the present invention may also include an integrated circuit module such as that shown in FIG. 12 wherein only two devices are fabricated for a single module. Such module may then be advantageously used for a combination local oscillator and modulator for frequency converting and modulating microwave energy received from another source. Furthermore, the cylindrical metal contact 96 shown in FIG. 12 may be used for a single IMPATT device (FIG. 6) while simultaneously omitting the top heat sink member thereof, such as the heat sink member 64 shown in FIG. 6. This alternative packaging technique will enable the device designer to take advantage of the parasitic inductance associated with the hollow or concave type of contact 96 and utilize same for matching the impedance of the IMPATT device with the waveguide or waveguide cavity in which the IMPATT device may eventually be mounted.

Referring now to FIGS. 13a and 13b, the values of frequency, impedance, width and height are given for four different operating frequencies for our structure in FIG. 12 and utilizing stripline metallization between adjacent devices for establishing paths of energy flow therebetween. These two figures are self-explanatory and require no further discussion herein.

Summarizing, therefore, the waveguide arrangement disclosed in FIGS. 7 through 13b can be readily formed with characteristic transmission impedance levels between 20 and 100 ohms for device matching and impedance transformation. Additionally, all of the above-described waveguide geometries can be formed using standard planar processing techniques without resort to critical processing procedures (e.g. mask alignment and micrometer resolution, multiple processing steps, etc.) The present invention provides a low-cost and efficient coupling between passivated microwave devices that can be formed in a single substrate and operated at millimeter wave frequencies between 30 and 300 gigahertz, and our monolithic integrated structure possesses the same mechanically strong ohmic contacting and heat sinking characteristics as are provided by our discrete IMPATT devices, such as the device illustrated in FIG. 6 above.

It will be appreciated by those skilled in the art that the invention as embodied in the microwave integrated circuit structure described above with reference to FIGS. 7 through 13b is not limited to the simple integrated combination of an IMPATT diode and a PIN diode, but rather can be extended to a wide variety of integrated microwave and millimeter-wave devices. For example, one might prefer to integrate a plurality of ion implanted IMPATT diodes in a common semiconductor substrate and spaced in a predetermined geometrical configuration so that the output powers of these IMPATT diodes may be combined. In this case, the microstrip or other selected waveguiding portions of the structure may be configured so as to couple the output powers of a plurality of these IMPATT diodes into a single power combining section of the structure. This configuration could thus have the effect of connecting a plurality of IMPATT diodes with their outputs in parallel.

Similarly, it may be preferred to configure, such as by selective etching, a common portion of the integrated semiconductor structure so as to form a hollow power-combining cavity to which a plurality of IMPATT diodes may be electromagnetically coupled. Selective etching may also be used to provide the required impedance transformation between these plurality of IMPATT diodes and the power-combining cavity or section of the structure, and such power-combinatorial techniques may rely in part upon the teachings in U.S. Pat. No. 3,931,587, assigned to the present assignee.

A further structural modification of our microwave integrated circuit within the scope of the present invention would be to incorporate ion implanted IMPATT diodes, PIN diodes, mixer diodes and the like in a high-resistivity dielectric image guide structure, such as that disclosed in copending application Ser. No. 669,054, also assigned to the present assignee.

Another modification within the scope of the present invention is the integration of microwave integrated structures, such as that shown in FIG. 12 above, with conventional waveguiding structures so as to adapt the present invention for use with existing larger known waveguiding structures conventionally used with IMPATT diodes and the like. One such conventional waveguiding structure is disclosed and claimed in U.S. Pat. No. 3,943,463, issued to H. J. Kuno et al and assigned to the present assignee. It may be preferred, for example, to couple the output power of our above-described microwave integrated structures into the stepped waveguiding apparatus of the above Kuno et al patent, and this may be accomplished by providing tapered sections of semiconductor material in the same semiconductor substrate in which our integrated devices are constructed. Thus, such tapered sections (not shown) provided in structures such as that shown in FIG. 12 may be used to launch millimeter-wave energy from our novel integrated structures into conventional waveguiding structures.

It should also be understood that the present invention is not limited to the use of linear devices such as a PIN diode modulator, and instead may use ion implanted digital devices, such as the steep-slope bistate varactor disclosed in the Stover et al U.S. Pat. No. 3,914,708, assigned to the present assignee. This varactor may be used in place of the PIN diode described above to provide digital switching of the millimeter-wave energy received from the adjacent IMPATT device or devices.

It will also be understood and appreciated by those skilled in the art that the present invention is not limited to fabrication of integrated microwave structures in silicon, and instead may be utilized in the GaAs technology and combined with known GaAs devices, such as the ion implanted GaAs transistors and diodes disclosed and claimed in U.S. Pat. No. 3,914,784 issued to R. G. Hunsperger et al and assigned to the present assignee. For example, it might be preferred to integrate a plurality of ion implanted IMPATT diodes in a single GaAs substrate with a corresponding plurality of cascaded GaAs field-effect transistors. The amplified output powers of these plurality of GaAs field-effect transistors could then be combined using one or more of the above-described power accumulation techniques. Thus, in accordance with the present invention, it might be preferred to utilize an angular geometry wherein a plurality of GaAs IMPATT diodes are initially selectively implanted in an angular configuration and thereafter a plurality of corresponding ion implanted GaAs FETs are also selectively implanted in an adjacent annular configuration so that they are coupled respectively to the IMPATT diodes and serve to amplify the output powers of the IMPATT diodes before being combined in a common output combining cavity or the like. For this proposed integrated circuit, it may be preferred to use suitable electromagnetic coupling techniques to convert the millimeter wave power from the IMPATT devices to gate voltages for the GaAs FETs, so that such gate voltages can be appropriately amplified in the GaAs FETs and obtain a maximum power gain therefrom.

Instead of using one of the above-described energy coupling means between adjacent devices on a single substrate, one may prefer to utilize proton bombardment of GaAs, such as is taught in copending application Ser. No. 345,625, in order to create high-resistivity waveguide coupling regions between adjacent devices. On the other hand, one may instead prefer to use known etch out and back fill techniques such as are taught in U.S. Pat. No. 3,445,925 to provide glass or SiO$_2$ channels of predetermined configuration between adjacent devices. Such channels would have a much higher resistivity than the bulk semiconductor substrate and would therefore tend to further reduce microwave losses in the structure. Furthermore, waveguides of greater depths are more easily achievable with such etch out and back fill techniques than with proton bombardment techniques. However, such channel forming techniques are not limited to chemical etching and instead may utilize an ion beam etching process, such as those processes disclosed in copending application Ser. No. 606,373, assigned to the present assignee.

Therefore, the present invention is intended to cover a broad class of microwave and millimeter wave integrated circuits wherein electromagnetic energy is propagated between active or passive planar devices in a single semiconductor substrate and propagated in some chosen waveguide medium and geometry which itself is integrated into the same semiconductor substrate.

What is claimed is:

1. A high frequency semiconductor structure including, in combination:
   (a) a high-resistivity semiconductor substrate having an ion implanted buried region therein and having an evacuated cavity region formed by the removal of a predetermined portion of said substrate and defining an opening aligned with said buried region for exposing at least a portion of same,
   (b) one or more doped regions aligned with said buried region and defining part of a semiconductor device within said substrate, with one of said doped regions extending to one surface of said substrate,
   (c) a passivating coating disposed on said one surface of said substrate and having an opening therein exposing at least a portion of said doped region extending to said one surface,
   (d) a first metallization pattern in ohmic contact with said doped region extending to said one substrate surface and overlying said passivating coating, and
   (e) a second metallization pattern disposed on the reverse surface of said substrate and extending into said evacuated cavity region and into ohmic contact with said buried region, whereby said first and second metallization patterns enable operating or modulating potentials to be applied to said semiconductor device or devices formed in said substrate, and said second metallization pattern provides heat sinking for said ion implanted regions while the thicker portion of said semiconductor substrate surrounding said ion implanted regions minimizes the parasitic capacitive coupling thereto.

2. The device defined in claim 1 which further includes a metal heat sink bonded to said second metallization pattern, whereby conductive heat sinks may, if desired, be applied to both said first and second metallization patterns to enhance the heat transfer capability of said semiconductor structure.

3. The device defined in claim 2 wherein said substrate adjacent said ion implanted buried region and the overlying doped regions has a predetermined lateral and vertical extent determined by the acceptable parasitic microwave losses during device operation.

4. A monolithic microwave integrated circuit including in combination:
   (a) a high-resistivity semiconductor substrate suitable for the propagation of microwave or millimeter wave energy, (b) two or more semiconductor devices located in predetermined spaced apart regions of said substrate so that said devices are surrounded by portions of said substrate and are there substantially DC isolated one from another, (c) a passivating coating disposed on the surface of said substrate and having openings therein aligned with said semiconductor devices for exposing at least a portion thereof extending to the substrate surface, (d) a plurality of control bias or switching voltage metallization patterns in ohmic contact with said two or more semiconductor devices respectively for applying either operating bias or switching or modulating potentials thereto during the operating of said integrated circuit, and (e) means between said contact metallization patterns and adjacent said passivating coating for establishing paths of microwave or millimeter wave energy flow between adjacent devices in said integrated circuit.

5. The integrated circuit according to claim 4 wherein said means adjacent said passivating coating includes stripline metallization patterns disposed on the surface of said passivating coating and between said contact metallization patterns.

6. A planar monolithic microwave integrated circuit including, in combination:

(a) a substrate of relatively high-resistivity semiconductive material including spaced-apart semiconductor devices formed therein in doped P and N type regions which are surrounded and isolated by said high-resistivity semiconductor material, said semiconductor devices having PN junctions which terminate at the surface of said substrate and are operative into the millimeter wave range, (b) an insulating layer of predetermined configuration formed on the surface of said substrate and overlying and passivating said PN junctions, said insulating layer and said substrate together having a predetermined thickness dimension which is related to both the frequency and mode of propagation of millimeter wave energy through said substrate and said insulating layer, (c) contact metallization overlying said insulating layer and extending into electrical contact with said semiconductor devices for connecting operating bias or switching voltages thereto, and (d) energy control metallization patterns of predetermined configuration disposed on the surface of said insulating layer and extending between said semiconductor devices for establishing the path of energy flow through said semiconductor substrate and said insulating layer, whereby said substrate provides high impedance isolation for semiconductor devices and also forms part of a waveguide sustaining millimeter wave energy propagation in said planar monolithic integrated circuit.

7. The integrated circuit defined in claim 6 wherein said substrate is high-resistivity silicon in excess of $10^3$ ohm centimeters.

8. The integrated circuit defined in claim 7 wherein said energy control metallization patterns comprise stripline metallization of predetermined geometry disposed on said insulating layer between said contact metallization for separate semiconductor devices.

9. The integrated circuit defined in claim 4 wherein said means between said contact metallization patterns include a dielectric image guide of predetermined rectangular cross section constructed from portions of both said high-resistivity substrate and said insulating layer thereon.

10. A monolithic microwave integrated circuit including, in combination:

(a) a high resistivity semiconductor substrate having a plurality of ion implanted buried regions therein and corresponding evacuated cavity regions formed by the removal of portions of said substrate and exposing parts of said buried regions, respectively, (b) one or more doped regions aligned respectively with each of said buried regions and defining multiple semiconductor devices within said substrate, with at least one of said doped regions of each device extending to one surface of said substrate, (c) a passivating coating disposed on said one surface of said substrate and having openings therein exposing portions of said doped regions of each device extending to said one substrate surface, (d) a first metallization pattern or patterns disposed on said passivating coating and extending into electrical contact respectively with the doped regions of said multiple semiconductor devices which extend to said one substrate surface, (e) a second metallization pattern disposed on the reverse surface of said substrate and extending into said cavity regions and into electrical contact with said buried regions of said multiple semiconductor devices for providing both electrical contact and heat sinking for said devices, whereby said first and second metallization patterns enable operating or modulating potentials to be applied to said multiple semiconductor devices during the transfer of energy therebetween and said second metallization pattern serves as a ground plane for said integrated circuit, and (f) means adjacent said passivating coating for establishing paths of microwave or millimeter wave energy flow between said multiple devices in said integrated circuit.

11. The integrated circuit defined in claim 10 wherein said means adjacent said passivating coating for establishing paths of energy flow includes strip-line metallization patterns disposed on the surface of said passivating coating and between said first metallization patterns thereon for confining energy flow substantially beneath said strip-line metallization patterns.

12. The integrated circuit defined in claim 11 which further includes a heat sink support member having upstanding conductive mesa regions therein extending respectively into said cavity regions in said substrate and into electrical contact with said second metallization pattern and providing support for said ground plane and good thermal conductivity away from said buried regions of each of said multiple semiconductor devices.

* * * * *